(12) United States Patent
Shang

(10) Patent No.: US 9,443,458 B2
(45) Date of Patent: Sep. 13, 2016

(54) DRIVING CIRCUIT AND DRIVING METHOD, GOA UNIT AND DISPLAY DEVICE

(71) Applicant: BOE TECHNOLOGY GROUP CO., LTD., Beijing (CN)

(72) Inventor: Guangliang Shang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 81 days.

(21) Appl. No.: 14/340,193

(22) Filed: Jul. 24, 2014

(65) Prior Publication Data

US 2015/0269879 A1 Sep. 24, 2015

(30) Foreign Application Priority Data

Mar. 21, 2014 (CN) .......................... 2014 1 0108691

(51) Int. Cl.
*G09G 3/20* (2006.01)
*G11C 19/28* (2006.01)

(52) U.S. Cl.
CPC ................. *G09G 3/20* (2013.01); *G11C 19/28* (2013.01); *G09G 2310/0267* (2013.01)

(58) Field of Classification Search
CPC ............ G09G 3/20; G09G 2320/252; G09G 2320/0214; G09G 2300/0819; G09G 2310/0248
See application file for complete search history.

(56) References Cited

U.S. PATENT DOCUMENTS

2004/0227718 A1 11/2004 Park
2007/0013413 A1* 1/2007 Chiang .............. H03K 19/0948
326/121
2011/0057926 A1* 3/2011 Shang .................. G09G 3/3677
345/213
2011/0274234 A1* 11/2011 Sakamoto ............ G11C 19/184
377/64
2013/0222357 A1* 8/2013 Tseng ........................ G09G 3/20
345/212

FOREIGN PATENT DOCUMENTS

| CN | 101242178 A | 8/2008 |
|----|-------------|--------|
| CN | 101556832 A | 10/2009 |
| CN | 103236245 A | 8/2013 |
| CN | 203870945 U | 10/2014 |
| JP | 2003273228 A | 9/2003 |

OTHER PUBLICATIONS

First Chinese Office Action dated Nov. 4, 2015, for corresponding Chinese Application No. 201410108691.7.
Second Chinese Office Action dated Jun. 12, 2016, for corresponding Chinese Application No. 201410108691.7.

* cited by examiner

*Primary Examiner* — Mark Regn
(74) *Attorney, Agent, or Firm* — Kinney & Lange, P.A.

(57) ABSTRACT

The embodiments of the present invention provide a driving circuit and a driving method, a GOA unit, a GOA circuit and a display device, to improve the response speed of the circuit and reduce the leakage current. This driving circuit comprises: at least one pull-up/pull-down unit each configured to pull up or pull down a voltage of a controlled node; each pull-up/pull-down unit comprises at least one double-gate transistor, the double-gate transistor is used to accelerate the charge or discharge of the node when being turned on, or is used to reduce the leakage current passing the node when being turned off. The embodiments of the present invention are suitable to be applied to the display production.

12 Claims, 9 Drawing Sheets

DRIVING CIRCUIT AND DRIVING METHOD, GOA UNIT AND DISPLAY DEVICE

CROSS-REFERENCE TO RELATED APPLICATION

This application claims the benefit of Chinese Patent Application No. 201410108691.7 filed on Mar. 21, 2014 in the State Intellectual Property Office of China, the whole disclosure of which is incorporated herein by reference.

BACKGROUND OF THE INVENTION

1. Field of the Invention

Embodiments of present invention relate to a display device, and in particular, to a driving circuit and a GOA unit for the display device, and the display device.

2. Description of the Related Art

In recent years, the development of display devices has a trend of high integration and low cost. GOA (Gate Driver on Array) technology for display devices has been developed. A gate driving integrated circuit portion may be omitted to reduce the material cost and production cost of display devices by integrating a gate switch circuit onto the array substrate of a display panel using the GOA technology. This gate switch circuit integrated onto the array substrate using the GOA technology is also referred to as a GOA circuit or a shift register circuit, wherein every shift register in this gate switch circuit is also referred to as a GOA unit.

Generally, the shift register circuit comprises a plurality of shift registers each corresponding to one gate line. In particular, the output end of each shift register is connected with one gate line; and the output end of the shift register is connected with the input end of a next shift register. The control structure of pull-up/pull-down TFT (Thin Film Transistor) of a shift register in the prior art generally uses single gate TFT. This structure may be applied to a-Si TFT, but when applied to oxide TFT, may lead to severe leakage of electricity and even render the shift register to work abnormally since the threshold voltage Vth is too low and the circuit responses slowly.

SUMMARY OF THE INVENTION

The embodiments of present invention provide a driving circuit, a GOA unit and a display device to improve the response speed of the circuit and reduce the leakage current.

According to the embodiment of one aspect of the present invention, there is provided a driving circuit, comprising at least one pull-up/pull-down unit, every pull-up/pull-down unit is configured to pull up or pull down a controlled node voltage; the every pull-up/pull-down unit comprises at least one double-gate transistor, the double-gate transistor is configured to accelerate charge or discharge of the node when being conducted; or the double-gate transistor is configured to reduce the leakage current passing the node when being cutoff.

According to the embodiment of another aspect of the present invention, there is provided a GOA unit comprising the above driving circuit.

According to the embodiment of a further aspect of the present invention, there is provided a display device comprising the above GOA circuit.

BRIEF DESCRIPTION OF THE DRAWINGS

To more clearly illustrate the technical solutions of the prior art or the embodiments of the present invention, figures needed in the description of the prior art or the embodiments are simply depicted.

DETAILED DESCRIPTION OF PREFERRED EMBODIMENTS OF THE INVENTION

The technical solutions in the embodiments of the present invention will be described clearly and completely hereinafter with reference to the attached drawings in the embodiments of the present invention. Apparently, the described embodiments are only part of the exemplary embodiments of the present invention and are not tended to covering all of the embodiments.

In addition, in the following detailed description, for the purposes of convenient explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Transistor used in all of the embodiments of the present invention may be thin film transistor (TFT), field effect transistor or other devices that have the same characteristics. Since the source and the drain of the transistor used herein are symmetrical, there is no substantial difference between the source and the drain. In the embodiments of the present invention, in order to distinguish the two electrodes except the gate of the transistor, one of the two electrodes is referred to as the source and the other of the two electrodes is referred to as the drain. Generally, in accordance with the arrangement in the figures, a middle end of the transistor is provided as the gate, an end for inputting signals is provided as the source, and an end for outputting signals is provides as the drain. In addition, the transistor used in the embodiments of the present invention may be a P type or an N type transistor. The P type transistor is conducted or turned on when electrical signal at the gate is at low level state, and the N type transistor is conducted or turned on when electrical signal at the gate is at high level state.

Figure 1:
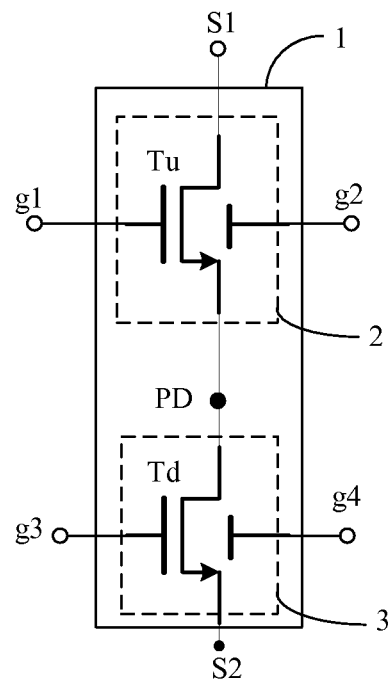
FIG. 1 is a principal schematic view of a driving circuit according to an exemplary embodiment of the present invention.

The embodiments of the present invention provide a driving circuit, as shown in FIG. 1, comprising at least one pull-up/pull-down unit 1 each configured to pull up or pull down a voltage of a controlled node, such as PD node. Each of the at least one pull-up/pull-down unit comprises at least one double-gate transistor. The double-gate transistor is used to accelerate the charge or discharge of the controlled node when being turned on, or is used to reduce leakage current passing through the controlled node when being cutoff or turned off.

Although the embodiment comprising two double-gate transistors Tu and Td is shown in FIG. 1, it will be appreciated that the driving circuit may comprise only one of the two double-gate transistors.

It will be appreciated that pull-up operation and pull-down operation of the pull-up/pull-down unit 1 on the voltage of the controlled node can occur simultaneously or asynchronously. That is, the pull-up/pull-down unit 1 may comprise only one double-gate transistor for pulling down the voltage of the controlled node or only one double-gate transistor for pulling up the voltage of the controlled node. In an alternative embodiment, the pull-up/pull-down unit 1 comprises a first double-gate transistor for pulling down the voltage of the controlled node and a second double-gate transistor for pulling up the voltage of the controlled node. Of course, in the case that the pull-up/pull-down unit 1 comprises the above two double-gate transistors, the simultaneous operations of pulling up and pulling down the voltage of the controlled node may be realized when the two double-gate transistors are conducted simultaneously.

Figure 11:
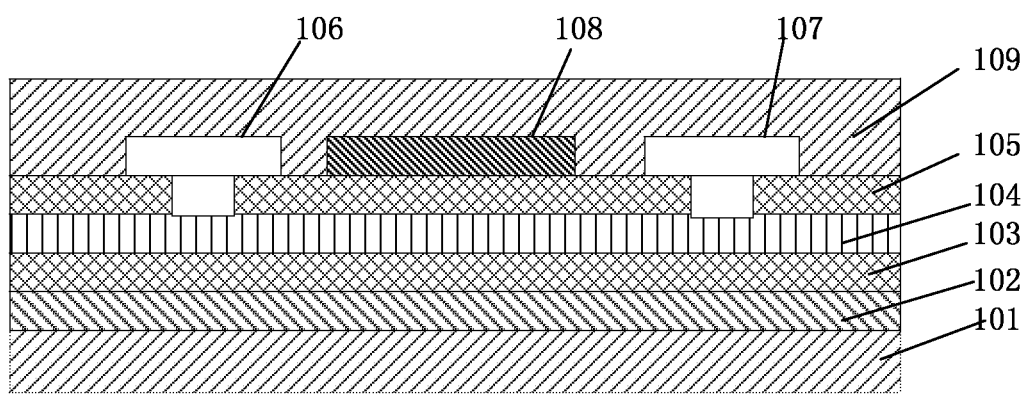
FIG. 11 is a simple cross-section view of a double-gate transistor according to an exemplary embodiment of the present invention.

In addition, the present invention does not limit the specific form of the double-gate transistor, that is, this double-gate transistor may be a double-gate transistor in the form of the bottom gate and the top gate, for example, the double-gate transistor has a first gate, which is referred to as the top gate and a second gate, which is referred to as the bottom gate, located on the opposite sides of the active layer, wherein the bottom gate and the top gate may have equal area or unequal areas. For example, the bottom gate has substantially the same area as that of the active layer, the top gate locates in the space between the source and the drain of the transistor; or the two gates of the double-gate transistor locate on the same side of the active layer. All of the schematic views in the present invention show the embodiments using the double-transistor in the form of the bottom gate and the top gate. One example of the double-transistor in the form of the bottom gate and the top gate is shown in FIG. 11. This double-gate transistor comprises a substrate 101, a second gate (bottom gate) 102 provided on the substrate 101, a insulating layer 103 covering the second gate 102, an active layer 104 provided on the insulating layer 103, an etching barrier layer 105 provided on the active layer 104, a source 106 and a drain 107 provided on the etching barrier layer 105, a first gate (top gate) 108 provided on the etching barrier layer 105 and located between the source 106 and the drain 107, and a passivation layer 109 covering the source 106, the gate 107 and the first gate 108.

Selectively, the transistor of the embodiments of the present invention may be transistor in many forms, such as amorphous-silicon transistor, low temperature poly silicon transistor and oxide transistor. For example, in an exemplary embodiment, the transistor may be oxide transistor.

Figure 2:
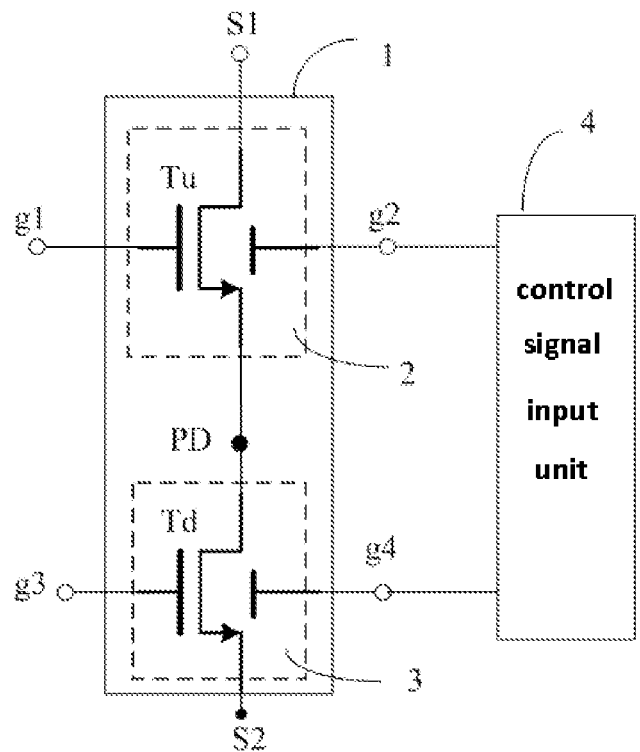
FIG. 2 is a principal schematic view of a driving circuit according to another exemplary embodiment of the present invention, wherein a control signal input unit is shown.

In an exemplary embodiment, the second gate of each double-gate transistor is connected with a control signal input unit 4, which is used to provide the same time sequence signal as that of the first gate of the double-gate transistor to the second gate of the double-gate transistor. As shown in FIG. 2, the top gate (the first gate) g1 of the double-gate transistor Tu is used as a first signal input end, and the bottom gate (the second gate) g2 is used to be connected with the control signal input unit 4; the top gate (the first gate) g3 of the double-gate transistor Td is used as a second signal input end, the bottom gate (the second gate) g4 is used to be connected with the control signal input unit 4. The bottom gate g2 obtains the same time sequence signal as that of the top gate g1 through the control signal input unit 4; the bottom gate g4 obtains the same time sequence signal as that of the top gate g3 through the control signal input unit 4.

In an exemplary embodiment, the driving circuit comprises at least one pull-up/pull-down unit 1 each comprising at least one double-gate transistor. The second gate (bottom gate) of the double-gate transistor of the pull-up/pull-down unit 1 is connected with the control signal input unit 4. The control signal input unit 4 is configured to provide different time sequence signal to the second gate of the double-gate transistor of the pull-up/pull-down unit. It will be appreciated that the second gate of each double-gate transistor is inputted with different time sequence signal when the driving circuit comprises more than two pull-up/pull-down unit 1 and each pull-up/pull-down unit comprises at least one double-gate transistor.

In an exemplary embodiment, see FIGS. 1 and 2, the driving circuit comprises at least one pull-up/pull-down unit 1 configured to be connected with a first signal end, a second signal end, a first signal input end, the controlled node PD and a second signal input end, such that the voltage of the controlled node PD is pulled to be flushed with that of the first signal end under the control of the first signal input end, or the voltage of the controlled node PD is pulled to be flushed with that of the second signal end under the control of the second signal input end.

As shown in FIGS. 1 and 2, the pull-up/pull-down unit 1 comprises a pull-up subunit 2 and a pull down subunit 3. The pull-up subunit 2 comprises one double-gate transistor Tu, the second gate g2 and the first gate g1 of this double-gate transistor Tu are connected with the same or different time sequence signals, the source S1 of this double-gate transistor is connected with the first signal end, and the drain of this double-gate transistor is connected with the controlled node PD; and/or, the pull-down subunit 3 comprises one double-gate transistor Td, the second gate g4 and the first gate g3 of this double-gate transistor Td are connected with the same or different time sequence signals, the source S2 thereof is connected with the second signal end, and the drain thereof is connected with the controlled node PD.

The driving circuit according to the embodiments of the present invention may accelerate the charge or discharge of the controlled node or reduce the leakage current passing the controlled node by providing the double-gate transistor in the driving circuit such that the pull-up/pull-down unit may pull up or pull down the voltage of the controlled node, thus improving the response speed of the circuit and reducing the leakage current.

The embodiment according to another aspect of the present invention is to provide a driving method for the above driving circuit, wherein the driving circuit comprises at least one double-gate transistor, the method comprises the following steps:

turning on the double-gate transistor to accelerate the charge or discharge of the node controlled by the drain of the double-gate transistor; or, cutting off the double-gate transistor to reduce the leakage current of the node controlled by the source of the double-gate transistor.

In an exemplary embodiment, the same or different time sequence signal may be inputted to the first gate and the second gate of the double-gate transistor. For example, the first gate and the second gate of the double-gate transistor are connected with each other.

The driving method provided by the embodiment of the present invention may accelerate the charge or discharge of the controlled node or reduce the leakage current passing the controlled node by providing the double-gate transistor in the driving circuit such that the pull-up/pull-down unit may pull up or pull down the voltage of the controlled node, thus improving the response speed of the circuit and reducing the leakage current.

The exemplary embodiment according to a further aspect of the present invention is to provide a GOA circuit comprising a plurality of GOA units in series. Except the first GOA unit and the last GOA unit, the input end of each GOA unit is connected with the output end of at least one preceding stage GOA unit. For example, the input end of every GOA unit is connected with the output end of the adjacent preceding stage GOA unit.

Figure 3:
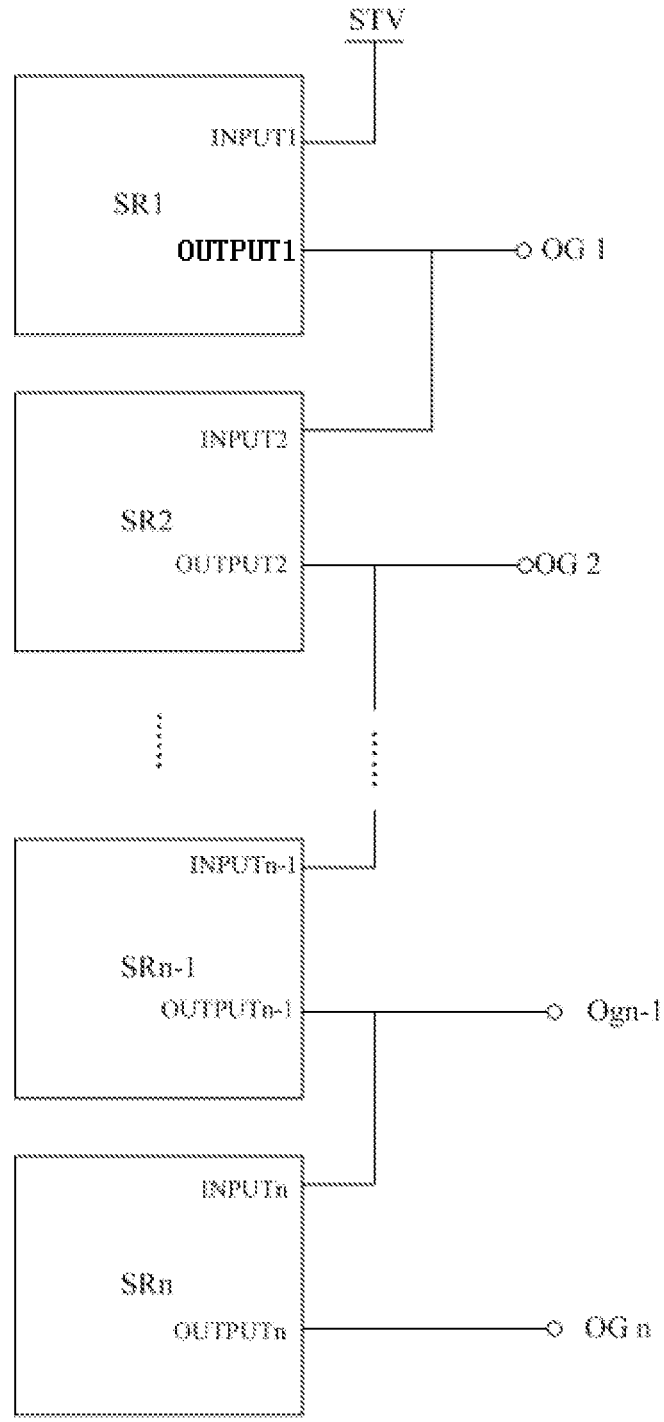
FIG. 3 is a principal schematic view of a GOA circuit according to an exemplary embodiment of the present invention.

In particular, the GOA circuit, as shown in FIG. 3, comprises a plurality of GOA units in series, wherein an output end OUTPUT1 of a first GOA unit SR1 is connected with a gate line OG1, and simultaneously connected with an input end INPUT2 of a second GOA unit SR2; an output end OUTPUT2 of the second GOA unit SR2 is connected with a gate line OG2, and simultaneously connected with an input end INPUT3 of a third GOA unit SR3. Similarly, an output end OUTPUT(n−1) of the (n−1)th GOA unit SR(n−1) is connected with an input end INPUTn of a nth GOA unit SRn. Furthermore, each GOA unit has a predetermined number of clock signals and a fixed input voltage to provide normal work voltage during the fixed time period.

Wherein, every GOA unit comprises any one of the driving circuits set forth in the above embodiments, and in particular, comprises at least one pull-up/pull-down unit each comprising at least one double-gate transistor. The pull-up/pull-down unit is configured to pull up or pull down the voltage of the controlled node.

The double-gate transistor is configured to accelerate the charge or discharge of the controlled node when being conducted, or is used to reduce the leakage current passing the controlled node when being cutoff.

It will be appreciated that the pulling up and pulling down of the voltage of the controlled node may occur simultaneously or asynchronously for each pull-up/pull-down unit. That is, the pull-up/pull-down unit may comprise only one double-gate transistor for pulling down the voltage of the controlled node or only one double-gate transistor for pulling up the voltage of the controlled node; or comprise the double-gate transistor for pulling down the voltage of the controlled node and the double-gate transistor for pulling up the voltage of the controlled node at the same time. Of course, in the case that the pull-up/pull-down unit comprises the above two double-gate transistors, the simultaneous operation of pulling up and pulling down the voltage of the controlled node can be realized when the two double-gate transistors are conducted simultaneously.

In addition, the present invention does not limit the specific form of the double-gate transistor, that is, this double-gate transistor may be a double-gate transistor in the form of the bottom gate and the top gate, for example, the double-gate transistor has a first gate, which is referred to as the top gate and a second gate, which is referred to as the bottom gate, located on the opposite sides of the active layer, wherein the bottom gate and the top gate may have equal area or unequal areas. For example, the bottom gate has substantially the same area as that of the active layer, the top gate locates in the space between the source and the drain of the transistor; or the two gates of the double-gate transistor locate on the same side of the active layer. All of the schematic views in the present invention show the embodiments using the double-transistor in the form of the bottom gate and the top gate.

Figure 4:
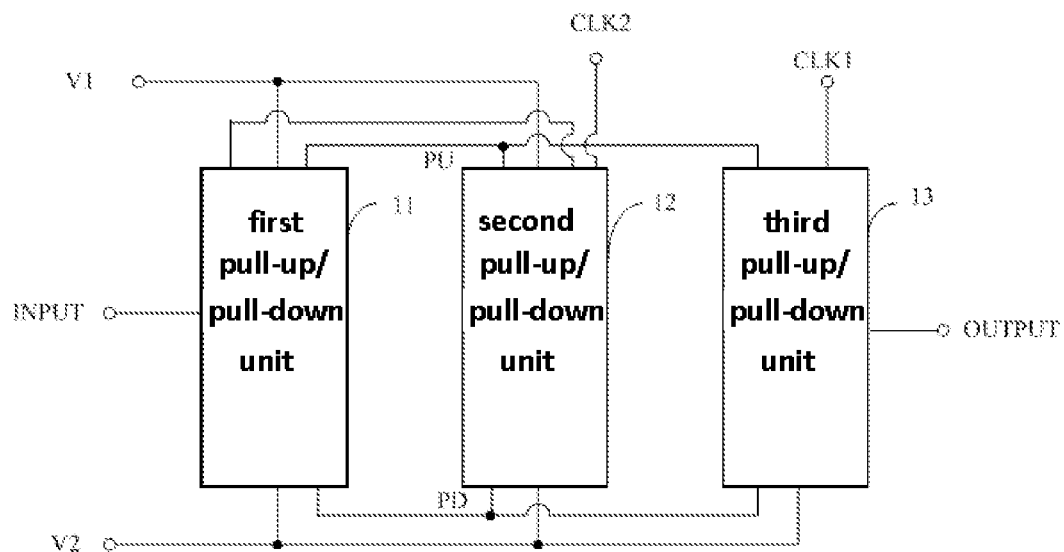
FIG. 4 is a principal block diagram of a GOA unit according to an exemplary embodiment of the present invention.

FIG. 4 shows a structure schematic view of any GOA unit in the above GOA circuit. Each GOA unit further comprises: a first clock signal end CLK1, a second clock signal end CLK2, and a first voltage end V1 and a second voltage end V2, wherein the first clock signal end CLK1 is connected with a first clock signal CLOCK1 of the system, and the second clock signal end CLK2 is connected with a second clock signal CLOCK2 of the system. The first voltage end V1 and the second voltage end V2 are designed according to the type of the transistor, wherein when the first voltage end V1 is at high level VDD, the second voltage end is at low level VSS; otherwise, when the first voltage end V1 is at low level VSS, the second voltage end is at high level VDD. The duty ratio of the high level or the low level of the first and the second clock signal CLOCK1 and CLOCK2 of the system may be set as necessary. For example, the duty ratios of both the high level and the low level of first and the second clock signal CLOCK1 and CLOCK2 of the system are 1:1. That is, the low level signal of the second clock signal CLOCK2 of the system begins after the low level signal of the first clock signal CLOCK1 of the system ends, the next low level signal of the first clock signal CLOCK1 of the system begins after the low level signal of the second clock signal CLOCK2 of the system ends, then the cycle repeats. The output of the high level signal is the same and thus will not be elaborated here. In the present embodiment, the input signal INPUT1 of the first GOA unit SR1 is an activating pulse signal. Selectively, the first clock signal CLOCK1 of the system starts to output after a frame initial signal STV signal ends.

More specifically, see FIG. 4, the GOA unit comprises:

a first pull-up/pull-down unit 11 configured to be connected with the first voltage end V1, the second voltage end V2, the signal input end INPUT, the first node PU and the second node PD, such that a voltage of the first node PU is pulled to be flushed with that of the first voltage end V1 under control of the signal input end INPUT, or a voltage of the first node PU is pulled to be flushed with that of the second voltage end V2 under control of the second node PD;

a second pull-up/pull-down unit 12 configured to be connected with the second clock signal end CLK2, the first voltage end V1, the second voltage end V2, the signal input end INPUT, the first node PU and the second node PD, such that a voltage of the second node PD is reduced to be flushed with the voltage of the first voltage end V1 under control of the second clock signal end CLK2, or a voltage of the second node PD is pulled to be flushed with that of the second voltage end V2 under control of the signal input end INPUT;

a third pull-up/pull-down unit 13 configured to be connected with the first clock signal end CLK1, the output end OUTPUT, the first node PU, the second node PD and the second voltage end V2, so that the signal of the first clock signal end CLK1 is outputted at the output end OUTPUT under control of the first node PU or a voltage at the output end OUTPUT is pulled to be flushed with that of the second voltage end V2 under control of the second node PD.

In the GOA unit and GOA circuit of the embodiments of the present invention, the pull-up/pull-down unit may pull up or pull down the voltage of the controlled node by providing the double-gate transistor, in order to accelerate the charge or discharge of the controlled node or reduce the leakage current passing the controlled node, thus improving the response speed of the circuit and reducing the leakage current.

Figure 5:
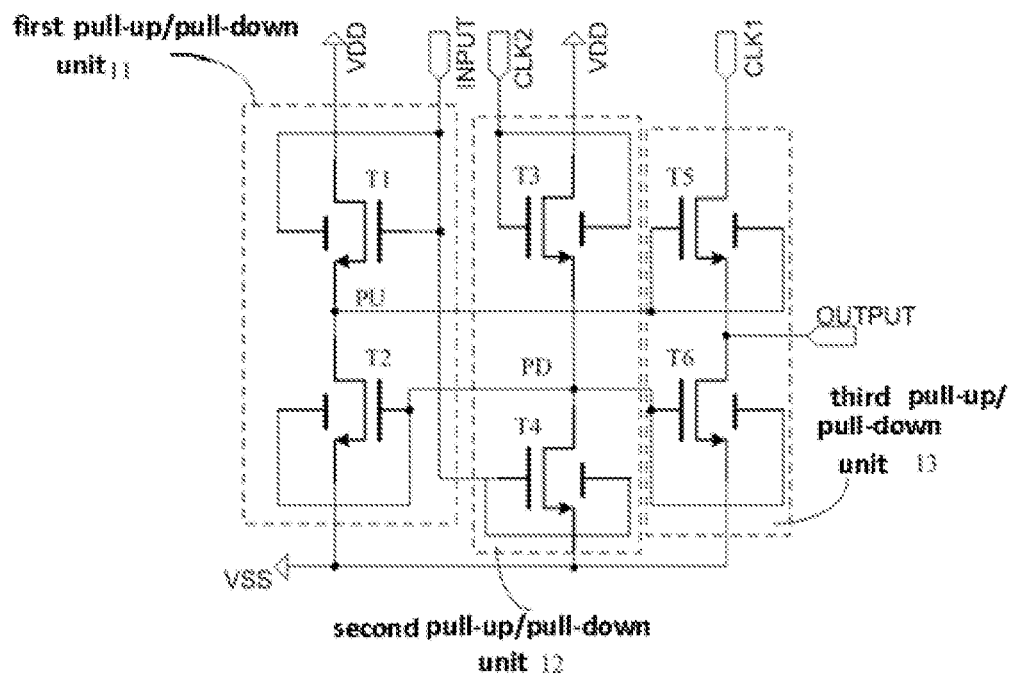
FIG. 5 is a circuit schematic view of an exemplary embodiment of the GOA unit as shown in FIG. 4.

In an exemplary embodiment of the present invention, see FIG. 5, the pull-up/pull-down unit 11 comprises a first transistor T1 and a second transistor T2. A source of the first transistor T1 is connected with the first voltage end V1 (VDD), a drain of the first transistor T1 is connected with the first node PU; and a first gate of the first transistor T1 is connected with the signal input end INPUT. A source of the second transistor T2 is connected with the first node PU, a drain of the second transistor T2 is connected with the second voltage end V2 (VSS), and a first gate and a second gate of the second transistor T2 is both connected with the second node PD.

The second pull-up/pull-down unit 12 comprises a third transistor T3 and a fourth transistor T4. A source of the third transistor T3 is connected with the first voltage end V1 (VDD), a drain of the third transistor T3 is connected with the second node PD, and a first gate of the third transistor T2 is connected with the second clock signal end CLK2; a source of the fourth transistor T4 is connected with the second node PD, a drain of the fourth transistor T4 is connected with the second voltage end V2 (VSS), and a first gate and a second gate of the fourth transistor T4 are both connected with the signal input end INPUT.

The third pull-up/pull-down unit 13 comprises a fifth transistor T5 and a sixth transistor T6. A source of the fifth transistor T5 is connected with the first clock signal end CLK1, a drain of the fifth transistor T5 is connected with the output end OUTPUT, and a gate of the fifth transistor T5 is connected with the first node PU; a source of the sixth transistor T6 is connected with the output end OUTPUT, a drain of the sixth transistor T6 is connected with the second voltage end V2 (VSS), and a first gate and a second gate of the sixth transistor T6 are both connected with the second node PD.

See FIG. 5, each of the first transistor T1, the second transistor T2, the third transistor T3, the fourth transistor T4, the fifth transistor T5 and the sixth transistor T6 comprises at least one double-gate transistor, each of the at least one double-gate transistor further comprises a second gate, and the first gate and the second gate of each of the at least one double-gate transistor is inputted with the same time sequence signal. Although FIG. 5 shows the embodiment in which all of the transistors are taken the form of double-gate transistor, the protection scope of the present invention is not limited thereto.

More specifically, to achieve the aim that the first gate and the second gate of one double-gate transistor is inputted with the same time sequence signal, the first gate and the second gate of the double-gate transistor is connected directly with each other. For example, as shown in FIG. 5, the first gate and the second gate of each of the transistors T1-T6 are connected with each other. In another embodiment, the second gate of one double-gate transistor is connected with the control signal input unit, and the control signal input unit is configured to provide the second gate of the one double-gate transistor with the same time sequence signal as that of the first gate of the one double-gate transistor. This control signal input unit may comprise single-chip or other devices or apparatuses that have the function of outputting time sequence signal.

Figure 6:
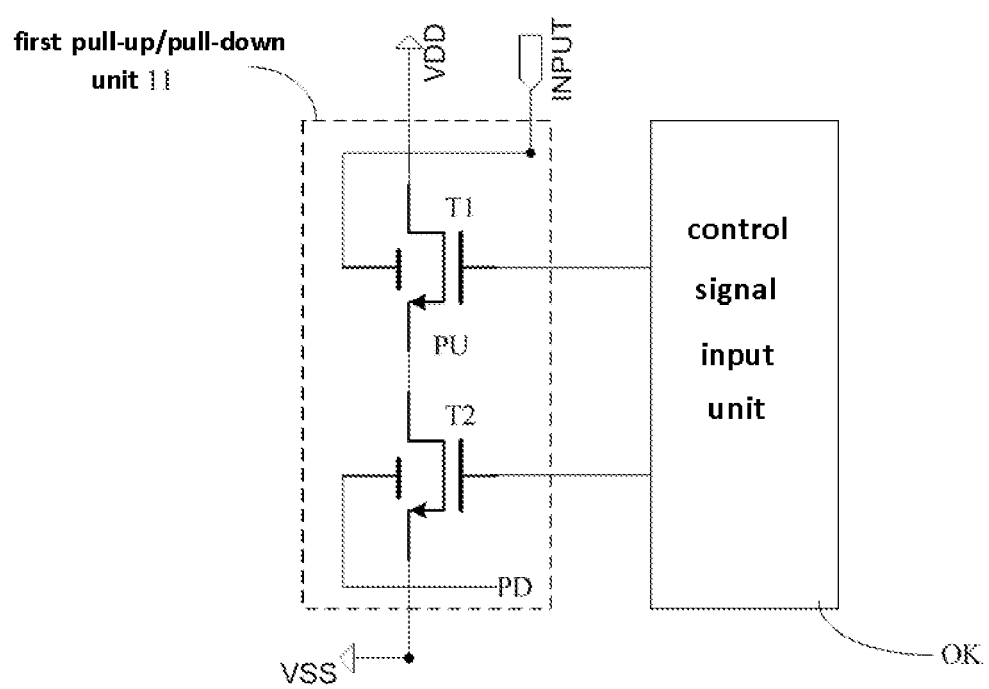
FIG. 6 is a structure schematic view of the connection of a pull-up/pull-down unit according to an exemplary embodiment of the present invention.

In an exemplary embodiment, as shown in FIG. 6, in the first pull-up/pull-down unit 11, a first gate of the double-gate transistor T1 is connected with INPUT, a second gate is connected with the control signal input unit OK; a first gate of the double-gate transistor T2 is connected with the second node PD, a second gate is connected with the control signal input unit. Of course, the present invention does not limit the first gate and the second gate. For example, the first gate is the top gate, the second gate is the bottom gate; or the second gate is the top gate, the first gate is the bottom gate. In addition, in FIG. 6, only the first pull-up/pull-down unit 11 is taken as an example to illustrate, the second gates of any other double-gate transistors in the GOA circuit may obtain the time sequence signal by the way of being connected with the control signal input unit OK. That is, the other double-gate transistors T2-T6 in FIG. 5 may be also connected the second gate thereof directly with the control signal input unit OK to obtain the time sequence signal. Wherein the control signal input unit OK may be realized in the form of programmable logic signal output devices, such as the single-chip.

Figure 7:
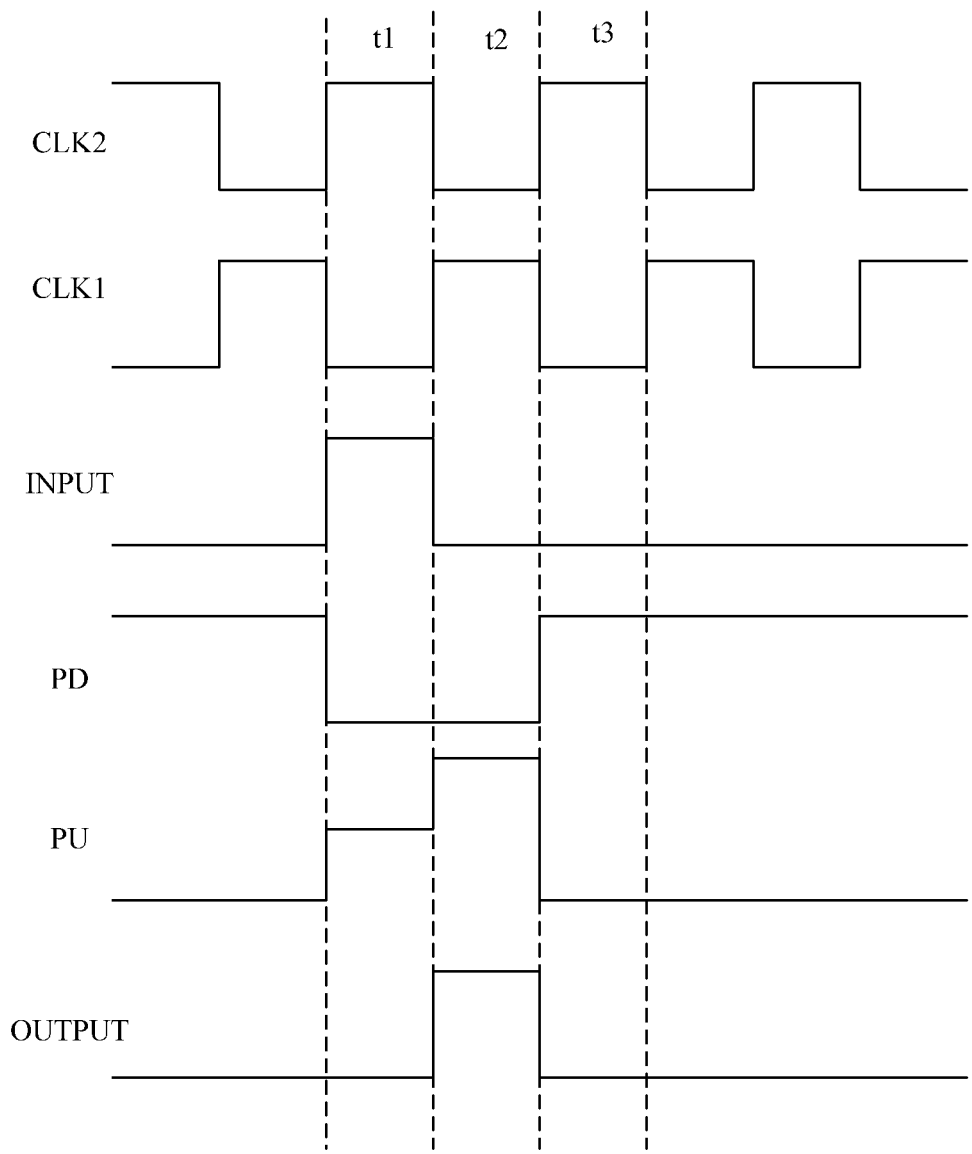
FIG. 7 is a schematic view of the time sequence signal for the GOA unit as shown in FIG. 5.

The work principal of the GOA unit shown in FIG. 5 is described with reference to the time sequence circuit shown in FIG. 7 hereinafter, wherein V1 is at high level VDD, V2 is at low level VSS, wherein all the transistors in the circuit shown in FIG. 5 are N type transistors, that is, all the transistors are conducted at high level and cutoff at low level.

In the first stage t1, the signal input end INPUT is at high level, CLK1 is at low level, CLK2 is at high level, the first transistor T1 is turned on to charge the node PU in order to pull the voltage of the node PU up to VDD, and the fourth transistor T4 is turned on to discharge the node PD in order to pull the voltage of the node PD down to VSS, at this time, the second transistor T2 and the sixth transistor T6 are held to be cutoff under control of the node PD.

In the second stage t2, the output end OUTPUT outputs a high level signal, CLK1 is at high level, and CLK2 is at low level. Since CLK1 is at high level, the level of the node PU is further increased due to the couple effect, at this time, the fifth transistor T5 is turned on to output the high level signal of CLK1; after the input of the preceding stage GOA, INPUT is switched into low level, T1, T4 are turned off.

In the third stage t3, the signal input end INPUT is at low level, the fourth transistor T4 is turned off. Since CLK2 is at high level, the third transistor T3 is turned on to pull the voltage of the node PD up to VDD, then the second transistor T2 is turned on to pull the voltage of the node PU down to VSS, and the sixth transistor T6 is turned on to pull the output end OUTPUT down to VSS.

Of course, the work principal of the GOA unit is illustrated by only taking the above three basic stages as example, but the present invention is not limited thereto, the GOA unit also comprise other necessary stages.

Figure 8:
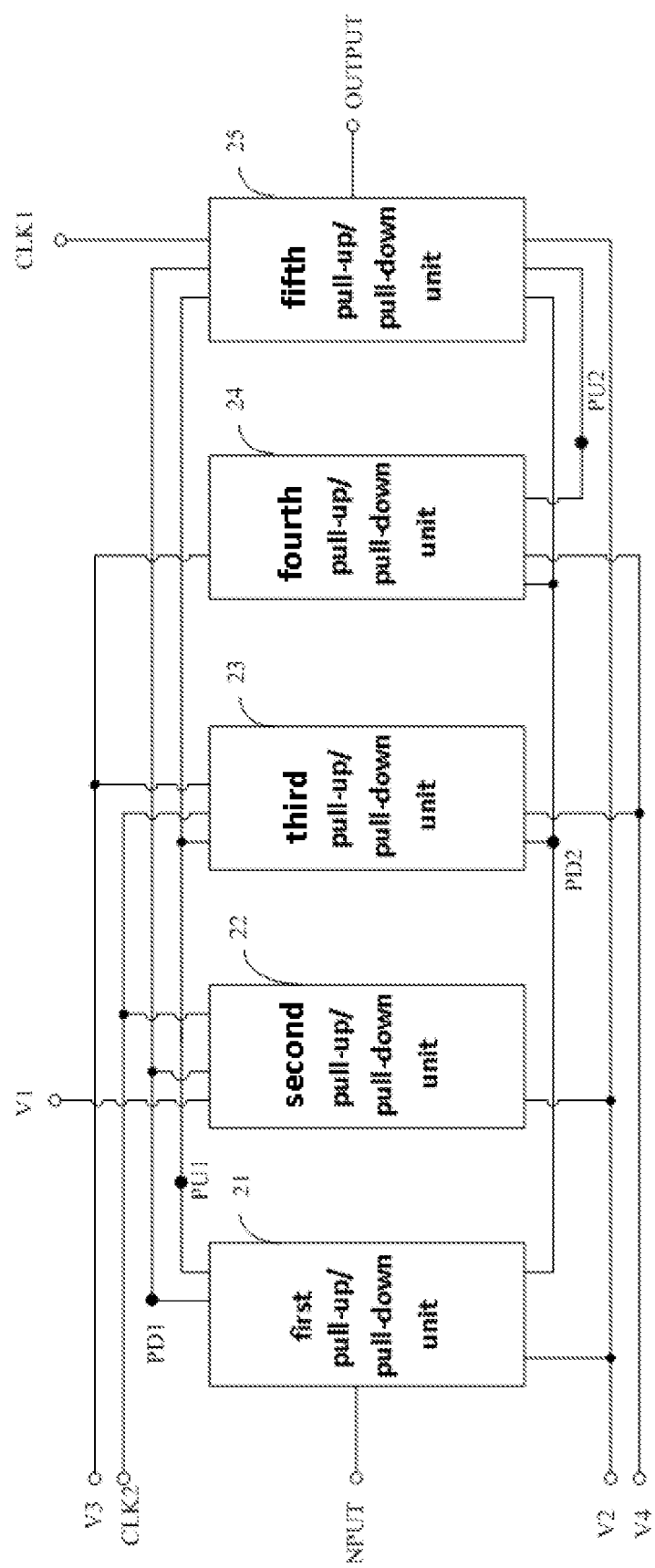
FIG. 8 is a principal block diagram of a GOA unit according to a further exemplary embodiment of the present invention.

FIG. 8 is a principal block diagram of a GOA unit in the GOA circuit according to a further exemplary embodiment of the present invention. See FIG. 8, each GOA unit comprises: a first clock signal end CLK1, a second clock signal end CLK2, a first voltage end V1, a second voltage end V2, a third voltage end V3 and the fourth voltage end V4. The first clock signal end CLK1 is connected with the first clock signal CLOCK1 of the system, and the second clock signal end CLK2 is connected with the second clock signal CLOCK2 of the system. The first voltage end V1 and the second voltage end V2 are a pair of associated reference voltages, and the voltage values of the first voltage end V1 and the second voltage end V2 are set according to the type of the transistors, wherein when the first voltage end V1 is at high level, the second voltage end is at low level, on the contrary, when the first voltage end V1 is at low level, the second voltage end is at high level. Similarly, the third voltage end V3 and the fourth voltage end V4 are a pair of associated reference voltages. The duty ratios of both the high level and the low level of the first and the second clock signal CLOCK1 and CLOCK2 of the system are 1:1. That is, the low level signal of the second clock signal CLOCK2 of the system begins after the low level signal of the first clock signal CLOCK1 of the system ends, the next low level signal of the first clock signal CLOCK1 of the system begins after the low level signal of the second clock signal CLOCK2 of the system ends, then the cycle repeats. The output of the high level signal of the first and the second clock signal of the system is the same and thus will not be elaborated here. In the present embodiment, the input signal INPUT1 of the first GOA unit SR1 is an activating pulse signal. In an embodiment, the first clock signal CLOCK1 of the system starts to output after the frame initial signal STV signal ends.

Continue to refer to FIG. 8, the GOA unit comprises:

a first pull-up/pull-down unit 21 configured to be connected with the signal input end INPUT, the first node PU1, the second voltage end V2, and the second node PD1 or the fourth node PD2, such that a voltage of the first node PU1 is pulled to be flushed with a voltage of the signal input end INPUT under control of the signal input end INPUT or a voltage of the first node PU1 is pulled to be flushed with that of the second voltage end V2 under control of the second node PD1 or the fourth node PD2;

a second pull-up/pull-down unit 22 configured to be connected with the second clock signal end CLK2, the first voltage end V1, the second node PD1 and the second voltage end V2, such that a voltage of the second node PD1 is pulled to be flushed with that of the first voltage end V1 under control of the second clock signal end CLK2 or a voltage of the second node PD1 is pulled to be flushed with that of the first voltage end V1 under control of the signal input end INPUT;

a third pull-up/pull-down unit 23 configured to be connected with the third voltage end V3, the fourth node PD2, the fourth voltage end V4, the first node PU1 and the second clock signal end CLK2, such that a voltage of the fourth node PD2 is pulled to be flushed with that of the third voltage end V3 under control of the second clock signal CLK2 or a voltage of the fourth node PD2 is pulled to be flushed with that of the fourth voltage end V4 under control of the first node PU1;

a fourth pull-up/pull-down unit 24 configured to be connected with the third voltage end V3, the third node PU2, the fourth node PD2 and the fourth voltage end V4, such that a voltage of the third node PU2 is pulled to be flushed with that of the third voltage end V3 under control of the third voltage end V3 or a voltage of the third node PU2 is pulled to be flushed with that of the fourth voltage end V4 under control of the fourth node PD2; and a fifth pull-up/pull-down unit 25 configured to be connected with the first clock signal end CLK1 and the output end OUTPUT, and the first node PU1 or the third node PU2, and also the second node PD1 or the fourth node PD2, such that the signal of the first clock signal end CLK is outputted at the output end OUTPUT under control of the first node PU1 or the third node PU2 or a voltage of the output end OUTPUT is pulled to be flushed with that of the second voltage end V2 under control of the second node PD1 or the fourth node PD2.

Figure 9:
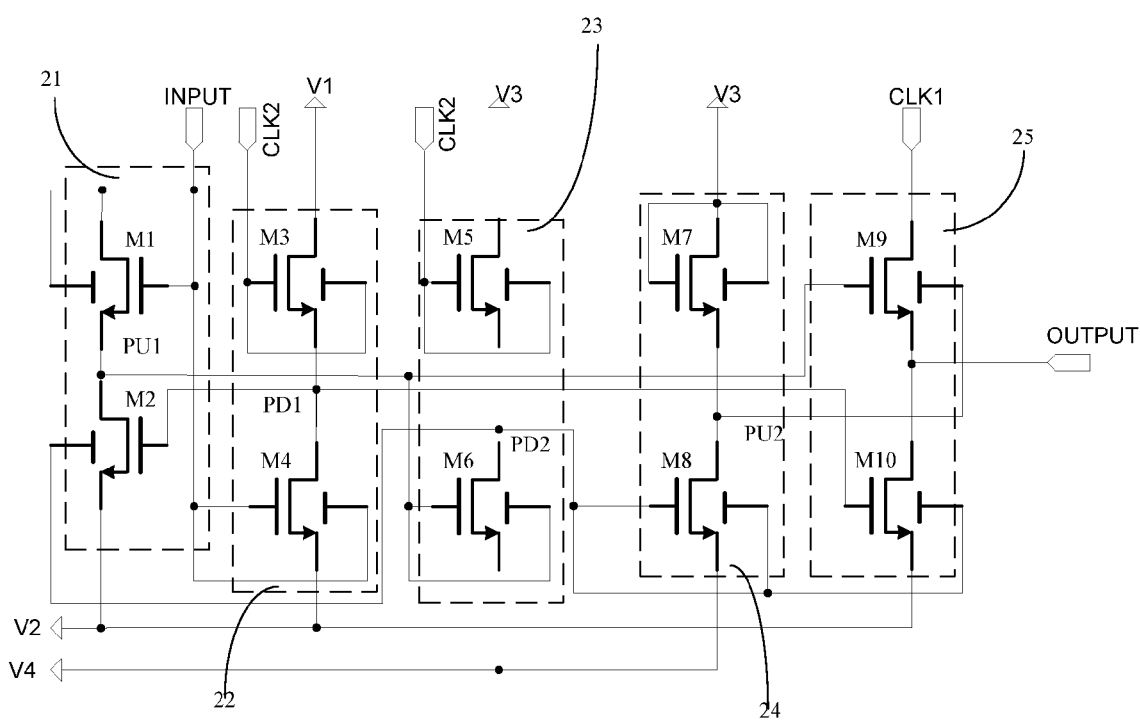
FIG. 9 is a circuit schematic view of an exemplary embodiment of the GOA unit as shown in FIG. 8.

More specifically, refer to FIG. 9, the first pull-up/pull-down unit 21 comprises a first transistor M1 and a second transistor M2. A source of the first transistor M1 is connected with the signal input end INPUT, a first gate of the first transistor M1 is connected with the signal input end INPUT, and a drain of the first transistor M1 is connected with the first node PU1. A source of the second transistor M2 is connected with the first node PU1, a drain of the second transistor M2 is connected with the second voltage end V2, and a first gate of the second transistor M2 is connected with the second node PD1 or the fourth node PD2.

The second pull-up/pull-down unit 22 comprises a third transistor M3 and a fourth transistor M4. A source of the third transistor M3 is connected with the first voltage end V1, a drain of the third transistor M3 is connected with the second node PD1, and a first gate of the third transistor M3 is connected with the second clock signal end CLK2. A source of the fourth transistor M4 is connected with the second node PD1, a drain of the fourth transistor M4 is connected with the second voltage end V2, and a first gate of the fourth transistor M4 is connected with the signal input end INPUT.

The third pull-up/pull-down unit 23 comprises a fifth transistor M5 and a sixth transistor M6. A source of the fifth transistor M5 is connected with the third voltage end V3, a drain of the fifth transistor M5 is connected with the fourth node PD2, and a first gate of the fifth transistor M5 is connected with the second clock signal end CLK2. A source of the sixth transistor M6 is connected with the fourth node PD2, a drain of the sixth transistor M6 is connected with the fourth voltage end V4, and a first gate of the sixth transistor M6 is connected with the first node PU1.

The fourth pull-up/pull-down unit 24 comprises a seventh transistor M7 and an eighth transistor M8. A source of the seventh transistor M7 is connected with the third voltage end V3, a first gate of the seventh transistor M7 is connected with the third voltage end V3, and a drain of the seventh transistor M7 is connected with the third node PU2. A source of the eighth transistor M8 is connected with the third node PU2, a first gate of the eighth transistor M8 is connected with the fourth node PD2, and a drain of the eighth transistor M8 is connected with the fourth voltage end V4.

The fifth pull-up/pull-down unit 25 comprises a ninth transistor M9 and a tenth transistor M10. A source of the ninth transistor M9 is connected with the first clock signal end CLK1, a first gate of the ninth transistor M9 is connected with the first node PU1 or the third node PU2, and a drain of the ninth transistor M9 is connected with the output end OUTPUT. A source of the tenth transistor M10 is connected with the output end OUTPUT, a first gate of the tenth transistor M10 is connected with the second node PD1 or the fourth node PD2, and a drain of the tenth transistor M10 is connected with the second voltage end V2.

In an exemplary embodiment, each of the first transistor M1, the third transistor M3, the fourth transistor M4, the fifth transistor M5, the sixth transistor M6, the seventh transistor M7 and the eighth transistor M8 comprises at least one double-gate transistor, each of the at least one double-gate transistor further comprises a second gate. Wherein the first gate and the second gate of each double-gate transistor are inputted with the same time sequence signal;

alternatively, the second transistor M2 is a double-gate transistor that comprises a second gate, the second gate of the second transistor M2 is connected with the fourth node PD2 or the second node PD1;

alternatively, the ninth transistor M9 is a double-gate transistor that comprises a second gate, the second gate of the ninth transistor M9 is connected with the third node PU2 or the first node PU1;

alternatively, the tenth transistor M10 is a double-gate transistor that comprises a second gate, the second gate of the tenth transistor M10 is connected with the fourth node PD2 or the second node PD1.

In an exemplary embodiment, the first gate and the second gate of one double-gate transistor are connected directly with each other in order that the first gate and the second gate of this double-gate transistor are inputted with the same time sequence signal, for example, the double-gate transistors M1, M3, M4, M5, M6, M7 and M8 shown in FIG. 8. In another embodiment, the second gate of the one double-gate transistor is connected with the control signal input unit, and the control signal input unit is used to provide the second gate of the double-gate transistor with the same time sequence signal as that of the first gate of the double-gate transistor. This control signal input unit may comprise singlechip or other devices or apparatus that have the function of outputting the time sequence signal. Although FIG. 9 shows the embodiment in which all of the transistors use double-gate transistor, the protection scope of the present invention is not limited thereto.

In the GOA unit according to the present embodiment, the pull-up/pull-down unit is configured to pull up or pull down the voltage of the controlled node by providing the double-gate transistor in the GOA unit, in order to accelerate the charge or discharge of the controlled node or reduce the leakage current passing the controlled node, thus can improve the response speed of the circuit and reduce the leakage current.

Figure 10:
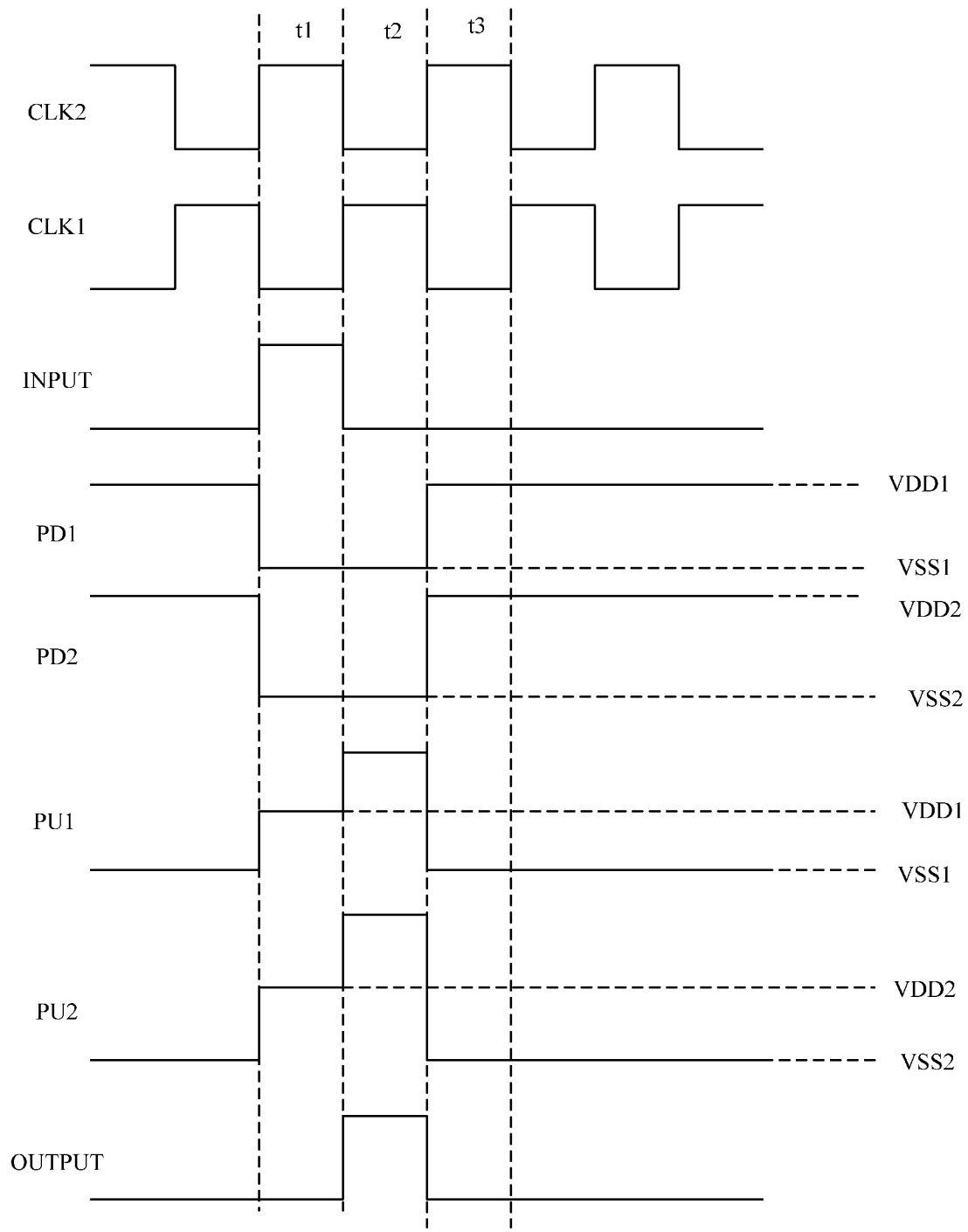
FIG. 10 is a schematic view of the time sequence signal for the GOA unit as shown in FIG. 8.

FIG. 10 is a schematic view of the time sequence signal for the GOA unit as shown in FIGS. 8 and 9. Similarly to the embodiment of the GOA unit corresponding to FIG. 5, each GOA unit shown in FIG. 9 also comprises three work stages, and the detailed work principal thereof will not be elaborated here. The difference between the GOA unit shown in FIG. 5 and the GOA unit shown in FIG. 9 is that, in the GOA unit shown in FIG. 9, V1 and V3 are at high level, V2 and V4 are at low level, wherein, the voltage amplitudes of the V1 and V3 are the same or different, and the voltage amplitudes of the V2 and V4 are the same or different. In the following embodiment, V1 is set as the first high level VDD1, V3 is set as the second high level VDD2, V2 is set as the first low level VSS1, and V4 is set as the second low level VSS2. In the case that all the transistors are turned on at high level and turned off at low level, when the voltage amplitudes of V1 and V3 are different from each other and the voltage amplitudes of V2 and V4 are different from each other, a higher pull-up voltage or lower pull-down voltage may be provided to the corresponding node to ensure the response speed of the circuit while reducing the leakage current. For example, in an exemplary embodiment, VDD1 is lower than or equal to VDD2, and VSS1 is higher than or equal to VSS2.

Those skilled in the art may appreciate that FIG. 9 only show one embodiment that realizes the general invention conception of the present invention. Based on the embodiment shown by FIG. 9, other figures can be conceived without departing from the protection scope of the present invention. In addition, description is made based on the turn-on state of the switch transistor, of course, when the type of the switch transistors is set, the control voltage of the gate thereof is determined. Therefore, the level of inputted or outputted signal reflected in the time sequence diagram is not described, which can be readily conceived by those skilled in the art. The embodiments of the present invention can also be implemented using P type transistor by adjusting the inputted signal time sequence or the level of the signal and will not be elaborated here.

The embodiment according to a further aspect of the present invention, there is provided a display device, such as display panel or array substrate.

In particular, when this display device is array substrate, the GOA circuit provided by the above embodiments is formed on the array substrate.

When this display device is a display panel, it comprises: a display area having a plurality of pixels for display images; the GOA circuit provided by the above embodiments for sending the scan signal to the display area; and a data driving circuit for sending the data signal to the display area. In addition, the display panel can be used as the display devices, such as electric paper, cell phone, television and digital photo frame.

The driving circuit, GOA unit, GOA circuit and display device according to the embodiments of the present invention may accelerate the charge or discharge of the node or reduce the leakage current passing the node by providing the double-gate transistor in the GOA unit such that the pull-up/pull-down unit pull up or pull down the voltage of the controlled node, thus can improve the response speed of the circuit and reduce the leakage current The foregoing is only preferred embodiments of the present invention, but the protection scope of the present invention is not limited thereto. It would be appreciated by those skilled in the art that under the disclosure scope of the present invention, various changes or modifications may be made and be contained in the protection scope of the present invention. Therefore, the protection scope of the present invention is defined in the claims.

What is claimed is:

1. A Gate Driver on Array (GOA), comprising at least one driving circuit each comprising a first pull-up/pull-down unit, a second pull-up/pull-down unit, a third pull-up/pull-down unit, a fourth pull-up/pull-down unit and a fifth pull-up-pull-down unit each being configured to pull up or pull down a voltage of a controlled node, wherein, the first pull-up/pull-down unit comprises:
a first transistor, a source of the first transistor being connected with a signal input end, a first gate of the first transistor being connected with the signal input end, and a drain of the first transistor being connected with a first node; and
a second transistor, a source of the second transistor being connected with the first node, a drain of the second transistor being connected with a second voltage end, and a first gate of the second transistor being connected with a second node or a fourth node;

the second pull-up/pull-down unit comprises:
a third transistor, a source of the third transistor being connected with a first voltage end, a drain of the third transistor being connected with the second node, and a first gate of the third transistor being connected with a second clock signal end; and
a fourth transistor, a source of the fourth transistor being connected with the second node, a drain of the fourth transistor being connected with the second voltage end, and a first gate of the fourth transistor being connected with the signal input end;

the third pull-up/pull-down unit comprises:
  a fifth transistor, a source of the fifth transistor being connected with a third voltage end, a drain of the fifth transistor being connected with the fourth node, and a first gate of the fifth transistor being connected with the second clock signal end; and
  a sixth transistor, a source of the sixth transistor being connected with the fourth node, a drain of the sixth transistor being connected with a fourth voltage end, and a first gate of the sixth transistor being connected with the first node;

the fourth pull-up/pull-down unit comprises:
  a seventh transistor, a source of the seventh transistor being connected with the third voltage end, a first gate of the seventh transistor being connected with the third voltage end, and a drain of the seventh transistor being connected with a third node; and
  an eighth transistor, a source of the eighth transistor being connected with the third node, a first gate of the eighth transistor being connected with the fourth node, and a drain of the eighth transistor being connected with the fourth voltage end; and the fifth pull-up/pull-down unit comprises:
  a ninth transistor, a source of the ninth transistor being connected with a first clock signal end, a first gate of the ninth transistor being connected with the first node or the third node, and a drain of the ninth transistor being connected with an output end; and
  a tenth transistor, a source of the tenth transistor being connected with the output end, a first gate of the tenth transistor being connected with the second node or the fourth node, and a drain of the tenth transistor being connected with the second voltage end.

2. The GOA unit according to claim 1, wherein, each of the first, third, fourth, fifth, sixth, seventh and eighth transistors comprises at least one double-gate transistor, each of the at least one double-gate transistor further comprises a second gate, wherein the first gate and the second gate of each of the at least one double-gate transistor are inputted with the same time sequence signal.

3. The GOA unit according to claim 2, wherein the second gate of each double-gate transistor is connected with a control signal input unit which is configured to provide the second gate of the double-gate transistor with the same time sequence signal as that of the first gate.

4. A display device, comprising a GOA circuit including a plurality of GOA units according to claim 1, wherein, except a first GOA unit and a last GOA unit of the plurality of GOA units, an input end of each GOA unit is connected with an output end of at least one preceding stage GOA unit.

5. The display device according to claim 4, wherein, each of the first, third, fourth, fifth, sixth, seventh and eighth transistors comprises at least one double-gate transistor, each of the at least one double-gate transistor further comprises a second gate, wherein the first gate and the second gate of each of the at least one double-gate transistor are inputted with the same time sequence signal.

6. The display device according to claim 5, wherein the second gate of each double-gate transistor is connected with a control signal input unit which is configured to provide the second gate of the double-gate transistor with the same time sequence signal as that of the first gate.

7. The display device according to claim 4, wherein, the second transistor is a double-gate transistor that comprises a second gate which is connected with the fourth node or the second node.

8. The display device according to claim 4, wherein, the ninth transistor is a double-gate transistor that comprises a second gate which is connected with the third node or the first node.

9. The display device according to claim 4, wherein, the tenth transistor is a double-gate transistor that comprises a second gate which is connected with the fourth node or the second node.

10. The GOA unit according to claim 1, wherein, the second transistor is a double-gate transistor that comprises a second gate which is connected with the fourth node or the second node.

11. The GOA unit according to claim 1, wherein, the ninth transistor is a double-gate transistor that comprises a second gate which is connected with the third node or the first node.

12. The GOA unit according to claim 1, wherein, the tenth transistor is a double-gate transistor that comprises a second gate which is connected with the fourth node or the second node.

* * * * *